US009268721B2

(12) United States Patent
Matsuo et al.

(10) Patent No.: US 9,268,721 B2
(45) Date of Patent: Feb. 23, 2016

(54) HOLDING BY A MEMORY CONTROLLER MULTIPLE CENTRAL PROCESSING UNIT MEMORY ACCESS REQUESTS, AND PERFORMING THE MULTIPLE CENTRAL PROCESSING UNIT MEMORY REQUESTS IN ONE TRANSFER CYCLE

(75) Inventors: Hisato Matsuo, Tokyo (JP); Rika Nagahara, Tokyo (JP); Kenji Ohtani, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 13/989,743

(22) PCT Filed: Oct. 6, 2011

(86) PCT No.: PCT/JP2011/073053

§ 371 (c)(1), (2), (4) Date: Aug. 5, 2013

(87) PCT Pub. No.: WO2012/070319

PCT Pub. Date: May 31, 2012

(65) Prior Publication Data

US 2014/0059286 A1 Feb. 27, 2014

(30) Foreign Application Priority Data

Nov. 25, 2010 (JP) ................................ 2010-262860

(51) Int. Cl.
*G06F 3/00* (2006.01)
*G06F 13/00* (2006.01)
*G06F 13/16* (2006.01)

(52) U.S. Cl.
CPC ................................ *G06F 13/1647* (2013.01)

(58) Field of Classification Search
None
See application file for complete search history.

(56) References Cited

U.S. PATENT DOCUMENTS 6,182,177 B1 * 1/2001 Harriman .................... 710/112
7,861,041 B2 12/2010 Williams (Continued)

FOREIGN PATENT DOCUMENTS

CN 1668999 9/2005
CN 101443734 A 5/2009

(Continued)

OTHER PUBLICATIONS

International Search Report, dated Dec. 21, 2011, for International Application No. PCT/JP2011/073053, 1 pp.

(Continued)

*Primary Examiner* — David E Martinez
(74) *Attorney, Agent, or Firm* — Rabindranath Dutta; Konrad, Raynes, Davda and Victor LLP

(57) ABSTRACT

The present invention includes a plurality of CPUs using memory as main memory, another function block using memory as a buffer, a CPU interface which controls access transfer from the plurality of CPUs to memory, and a DRAM controller for performing arbitration of the access transfer to the memory. Therein, the CPU interface causes access requests from the plurality of CPUs to wait, and receives and stores the address, data transfer mode and data size of each access, notifies the DRAM controller of the access requests, and then, upon receiving grant signals for the access requests, sends information to the DRAM controller according to the grant signals, whereupon the DRAM controller receives the grant signals, and on the basis of the access arbitration, specifies CPUs for which transfers have been granted so as to send the grant signals to the CPU interface.

17 Claims, 7 Drawing Sheets

(56) References Cited

U.S. PATENT DOCUMENTS

| | | | | |
|---|---|---|---|---|
| 8,065,459 | B2 | 11/2011 | Bekooij | |
| 8,285,895 | B2 | 10/2012 | Schramm et al. | |
| 9,036,286 | B2 | 5/2015 | Fujihara et al. | |
| 2006/0047874 | A1 * | 3/2006 | Watanabe et al. | 710/244 |
| 2006/0059319 | A1 | 3/2006 | Frenzel et al. | |
| 2007/0055813 | A1 | 3/2007 | Ingram et al. | |
| 2008/0082707 | A1 * | 4/2008 | Gupta et al. | 710/110 |
| 2009/0063776 | A1 | 3/2009 | Williams | |
| 2010/0115168 | A1 | 5/2010 | Bekooij | |
| 2011/0261480 | A1 | 10/2011 | Fujihara et al. | |

FOREIGN PATENT DOCUMENTS

| | | | |
|---|---|---|---|
| CN | 102265348 | | 11/2011 |
| JP | 10-049429 | | 2/1998 |
| JP | 2002-268942 | | 9/2002 |
| JP | 2002268942 | | 9/2002 |
| JP | 2007-073052 | | 3/2007 |
| TW | 200907688 | A | 2/2009 |
| TW | 200912742 | A | 3/2009 |
| WO | 2010/073776 | | 7/2010 |
| WO | 2010073776 | | 7/2010 |
| WO | 2012070319 | | 5/2012 |

OTHER PUBLICATIONS

Information Materials for IDS, dated Oct. 9, 2013, pp. 1-2.

Japanese Office Action, dated Sep. 3, 2013, pp. 1-2.

Machine Translation for JP2002-268942, published Sep. 20, 2002, pp. 1-28.

Machine Translation for JP10-049429, published Feb. 20, 1998, pp. 1-11.

Machine Translation for TW200907688A, published Feb. 16, 2009, Total 14 pages.

Machine Translation for TW200912742A, published Mar. 16, 2009, Total 14 pages.

Machine Translation for CN1668999, published Sep. 14, 2005, Total 14 pages.

Machine Translation for CN101443734A, published May 27, 2009, Total 12 pages.

Information Materials for IDS, dated Jan. 30, 2015, Total 2 pages.

Information Materials for IDS, dated Feb. 12, 2015, Total 4 pages.

U.S. Pat. No. 7,861,041 is an English Counterpart to TW200912742A.

U.S. Pat. No. 8,065,459 is an English Counterpart to CN101443734A.

U.S. Pat. No. 8,285,895 is an English Counterpart to TW200907688.

U.S. Pat. No. 9,036,286 is an English counterpart to CN102265348.

Publication 20060059319 is an English Counterpart to CN1668999.

Publication 2009043916 is an English Counterpart to TW200907688A.

Publication 20090063776 is an English Counterpart to TW200912742A.

Publication 20100115168 is an English Counterpart to CN101443734A.

Machine Translation for CN102265348, published Nov. 30, 2011, Total 18 pages.

* cited by examiner

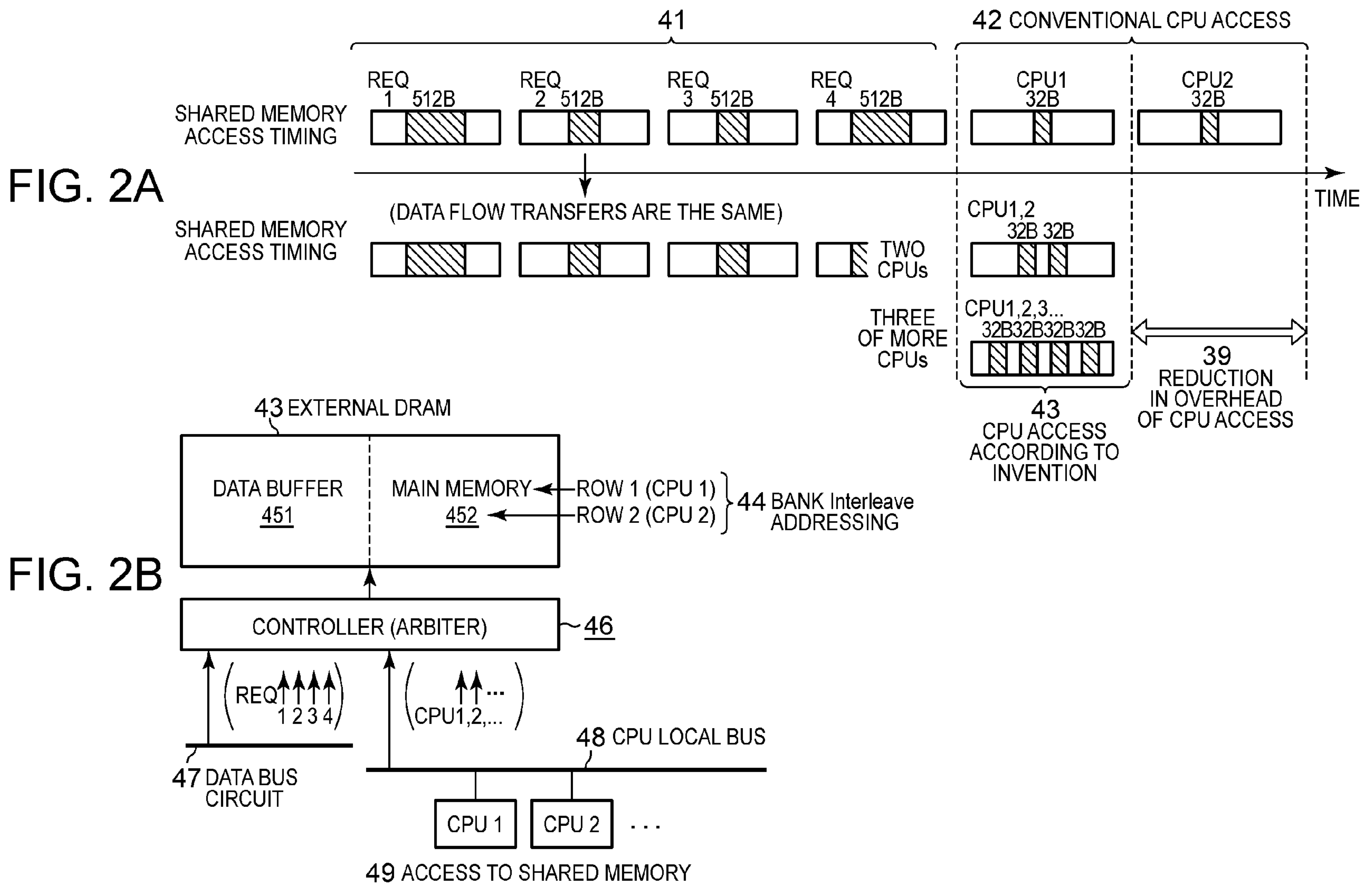
FIG. 2A
41
42 CONVENTIONAL CPU ACCESS
SHARED MEMORY ACCESS TIMING
REQ 1 512B
REQ 2 512B
REQ 3 512B
REQ 4 512B
CPU1 32B
CPU2 32B
TIME
(DATA FLOW TRANSFERS ARE THE SAME)
SHARED MEMORY ACCESS TIMING
TWO CPUs
CPU1,2 32B 32B
THREE OF MORE CPUs
CPU1,2,3... 32B32B32B32B
39 REDUCTION IN OVERHEAD OF CPU ACCESS
43 CPU ACCESS ACCORDING TO INVENTION
FIG. 2B
43 EXTERNAL DRAM
DATA BUFFER 451
MAIN MEMORY 452
ROW 1 (CPU 1)
ROW 2 (CPU 2)
44 BANK Interleave ADDRESSING
CONTROLLER (ARBITER)
46
REQ 1 2 3 4
CPU1,2,...
47 DATA BUS CIRCUIT
48 CPU LOCAL BUS
CPU 1
CPU 2
49 ACCESS TO SHARED MEMORY

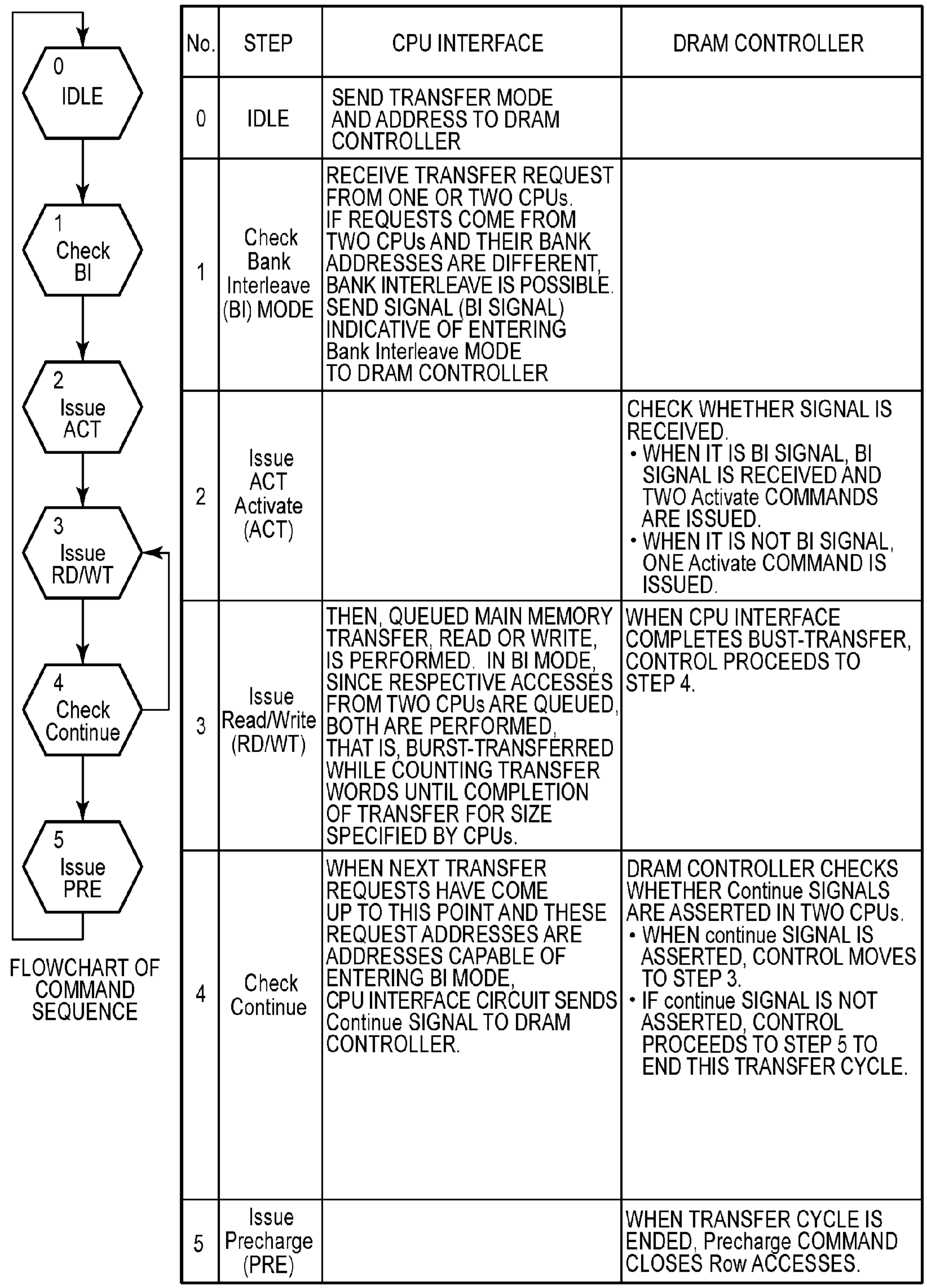

| No. | STEP | CPU INTERFACE | DRAM CONTROLLER |
| --- | --- | --- | --- |
| 0 | IDLE | SEND TRANSFER MODE AND ADDRESS TO DRAM CONTROLLER | |
| 1 | Check Bank Interleave (BI) MODE | RECEIVE TRANSFER REQUEST FROM ONE OR TWO CPUs. IF REQUESTS COME FROM TWO CPUs AND THEIR BANK ADDRESSES ARE DIFFERENT, BANK INTERLEAVE IS POSSIBLE. SEND SIGNAL (BI SIGNAL) INDICATIVE OF ENTERING Bank Interleave MODE TO DRAM CONTROLLER | |
| 2 | Issue ACT Activate (ACT) | | CHECK WHETHER SIGNAL IS RECEIVED. • WHEN IT IS BI SIGNAL, BI SIGNAL IS RECEIVED AND TWO Activate COMMANDS ARE ISSUED. • WHEN IT IS NOT BI SIGNAL, ONE Activate COMMAND IS ISSUED. |
| 3 | Issue Read/Write (RD/WT) | THEN, QUEUED MAIN MEMORY TRANSFER, READ OR WRITE, IS PERFORMED. IN BI MODE, SINCE RESPECTIVE ACCESSES FROM TWO CPUs ARE QUEUED, BOTH ARE PERFORMED, THAT IS, BURST-TRANSFERRED WHILE COUNTING TRANSFER WORDS UNTIL COMPLETION OF TRANSFER FOR SIZE SPECIFIED BY CPUs. | WHEN CPU INTERFACE COMPLETES BUST-TRANSFER, CONTROL PROCEEDS TO STEP 4. |
| 4 | Check Continue | WHEN NEXT TRANSFER REQUESTS HAVE COME UP TO THIS POINT AND THESE REQUEST ADDRESSES ARE ADDRESSES CAPABLE OF ENTERING BI MODE, CPU INTERFACE CIRCUIT SENDS Continue SIGNAL TO DRAM CONTROLLER. | DRAM CONTROLLER CHECKS WHETHER Continue SIGNALS ARE ASSERTED IN TWO CPUs. • WHEN continue SIGNAL IS ASSERTED, CONTROL MOVES TO STEP 3. • IF continue SIGNAL IS NOT ASSERTED, CONTROL PROCEEDS TO STEP 5 TO END THIS TRANSFER CYCLE. |
| 5 | Issue Precharge (PRE) | | WHEN TRANSFER CYCLE IS ENDED, Precharge COMMAND CLOSES Row ACCESSES. |

FIG. 7

HOLDING BY A MEMORY CONTROLLER MULTIPLE CENTRAL PROCESSING UNIT MEMORY ACCESS REQUESTS, AND PERFORMING THE MULTIPLE CENTRAL PROCESSING UNIT MEMORY REQUESTS IN ONE TRANSFER CYCLE

FIELD OF THE INVENTION

The present invention relates to memory access control for multiple processors included in an information apparatus.

BACKGROUND ART

Reduction in power consumption and cost reduction is key issue for a storage device. For example, reduction in the number of used DRAM memories makes a huge contribution to the reduction in power consumption, cost, and footprint. Recently, SoC LSI equipped with multiple CPUs has been developed. In general, each of the multiple CPUs needs a main memory, respectively. Sharing the multiple CPU memories with other DRAM memories on the LSI can reduce the number of DRAM memories used as the main memories.

FIG. 1 shows an ASIC having a DRAM memory shared between access from a CPU (CPU access) and data flow transfers, and an arbiter enabling the sharing of the memory. In this shared memory configuration, a data buffer for data flows and a main memory of the CPU share the same DRAM memory chip. In the shared memory, usable areas of one DRAM memory are physically separated from each other.

Firmware using a CPU controls hardware such as a dataflow ASIC to transfer data to and from recording media. Since the body of code of the firmware is placed in a main memory, access to the main memory occurs in the operation of the firmware. A delay from when an access request to the main memory is issued until completion of the request is a latency time of the CPU. The longer this latency time, the lower the performance of the CPU.

In this method, if respective data transfers get stuck, this ends up an interruption of a host transfer or reduction in media transfer performance. If the architecture of a data buffer is contemplated, requirements for necessary bands upon simultaneous occurrence of data transfer requests from all blocks need to be satisfied, respectively. Even if a memory is shared between the main memory and the data buffer, the throughput of data flow transfers and CPU access needs to be satisfied. Particularly, when the device is equipped with multiple CPUs, the bandwidth of the DRAM memory needs to be secured. However, the physical band of the DRAM memory, which is decided based on the bus width and frequency, is limited.

Further, the turn around time of a main memory access affects the performance of the CPU. If a request for access to the main memory comes during a transfer other than the main memory access (e.g., data flow transfer), the request will need to wait until completion of the current transfer. Thus, when a memory is shared between the main memory and another DRAM memory, the following problems arise.

1. How to guarantee a required bandwidth of main memory accesses for multiple CPUs within a limited bandwidth. An easy way to ensure the required bandwidth is to increase the physical bandwidth. However, widening the bus width to increase the bandwidth leads to an increase in the number of chips used, and this defeats the intended purpose of reducing the number of memory parts. On the other hand, raising the operating frequency leads to an increase in power consumption, and this is not a perfect solution.

Reducing transfer overhead is effective to improve the bandwidth within a given physical bandwidth. In DRAM technology commonly used, such as DDR3 SDRAM, if the burst transfer length increases by one access, the ratio of overhead can be reduced. In a memory architecture that satisfies the required bandwidth, it is effective to give a long burst transfer length for blocks with high required bandwidth and a short burst transfer length for blocks with low required bandwidth. Data buffer of IBM tape drives is designed based on this concept, achieving relatively low operating frequency with high data transfer efficiencies.

However, in the case of main memory accesses for which the turn around time is a key issue, if memory access is being performed by another block when a main memory request comes, the main memory access needs to wait until completion of the current transfer. It is a possible option to resolve this issue to interrupt the current transfer and allow the main memory transfer, but this cannot be employed in a system with high performance required because this degrades the other blocks' bandwidth.

The overhead in DRAM technology includes a mode register set command (MRS), a command to activate a row address to be accessed (Activate), a command to close the row used (Precharge), a refresh command (Refresh), and others. In accordance with these commands, no data is transferred. Applying the specifications, there is an existing technique not to issue a Precharge command to accesses with consecutive addresses. This is effective for a DRAM exclusively used as a main memory, and this actually leads to overhead reduction. However, in the case of a memory shared among CPUs used for different purposes, this method is not effective because the memory is used by dividing the physical area of the memory and hence the addresses are not consecutive.

The access from a CPU to a main memory is an access in bytes or by a cache line. In the case of a CPU in a built-in system, the cache line is 32 bytes or 64 bytes. In this case, if the data bus for the DRAM memory is 32 bits, the transfer will be in eight bursts or 16 bursts. Thus, the CPU access is not efficient in terms of burst transfer, increasing the overhead.

2. How to reduce turn around time of main memory requests

As mentioned in the above problem 1, if a request for access to the main memory comes during a transfer of another block (e.g., data flow), the main memory request needs to wait until completion of the current transfer. In the case of an arbiter designed to assign the highest priority to the main memory access, the access is allowed to transfer data. The transfer cycle of any other block is at least about 20 clocks on the DRAM memory clock, and this is one of main factors to increase the latency of the main memory access. The method of interrupting the transfer of another block needs to consider a system to compensate for the interruption penalty. To this end, since a retransfer cycle is required, then the transfer overhead increases, making it difficult to guarantee the bandwidth of the block.

Patent Document 1 relates to a bus access arbitration system for data buffer accesses between a host side and a CD media side. When controlling accesses of multiple blocks in a CD drive to a data buffer, this bus access arbitration system puts priorities to accesses from respective blocks and restrictions on the number of accesses therefrom.

PRIOR ART REFERENCE

Patent Document

[Patent Document 1]
Japanese Patent Application Publication No. 11-120124

SUMMARY OF THE INVENTION

Problem to be Solved by the Invention

The bus arbitration system of Patent Document 1 does not include latency of CPU accesses and throughputs of CPUs and multiple transfer blocks in a memory system in which a memory is shared by main memories of multiple CPUs and a data buffer memory.

The present invention provides a memory access device including shared memory mechanism and method for multiple CPUs equipped in an information apparatus (e.g., storage device).

Means for Solving the Problems

In order to achieve the above objective, the present invention provides a memory access device for shared use of main memories for multiple CPUs and a data buffer for other functional blocks. This memory access device includes:

the multiple CPUs using a memory as these main memories;

the other functional blocks using the memory as these data buffer;

a CPU interface circuit connected to a bus for the CPUs to control memory access requests from the multiple CPUs; and a memory controller connected to the CPU interface circuit to arbitrate memory access requests from the CPUs and the functional blocks, wherein the CPU interface circuit holds access requests from the multiple CPUs while receiving and storing the address, the data transfer mode and the data size of each access, notifies the memory controller of the access requests, and when receiving an Allowed signal for the access requests, the CPU interface circuit sends the information to the memory controller in response to the Allowed signal, and the memory controller receives the access request signals, specifies a CPU whose access request is allowed from access arbitration, and sends the Allowed signal to the CPU interface circuit.

This memory access device is characterized in that the memory is a DRAM.

This memory access device is characterized in that when the memory controller does not send the Allowed signal for the access requests, the CPU interface circuit holds awaiting access requests from the multiple CPUs.

This memory access device is characterized in that the memory controller executes a transfer sequence of multiple CPU accesses in one bus cycle.

This memory access device is characterized in that, when receiving access requests from multiple CPUs, if the transfer of another block is being performed, the memory controller holds the multiple CPU access requests, and after completion of the data flow transfer, the multiple CPU access requests are performed in one transfer cycle.

This memory access device is characterized in that the memory controller performs (a) access requests from the multiple CPUs in one transfer cycle using a bank interleave of the DRAM.

This memory access device is characterized in that, (b) when the following access requests are from the same CPUs as the memory controller holds during execution of the transfer of another block, the memory controller holds the multiple CPU access requests, and after completion of the data flow transfer, performs the multiple CPU accesses in one transfer cycle.

This memory access device is characterized in that, the transfer of (a), and the transfer of (b) are performed in combination.

This memory access device is characterized in that the CPU interface circuit includes:

a step (Idle) of sending a transfer mode (Read/Write) and an address of each access to the memory controller;

a step of receiving transfer requests from multiple CPUs, and when these bank addresses are different, sending a BI signal which indicates to enter bank interleave mode to the memory controller;

a step of counting transfer words, performing the holding transfer requests, Read, or Write, until the word count reaches the transfer size of respective CPU accesses, and in the bank interleave mode, since respective accesses from CPUs are held, performing both of them; and a step in which, when the following transfer requests come and these request addresses are the same bank addresses as previous ones, the CPU interface circuit sends a Continue signal to the memory controller, and the memory controller includes:

a step of checking whether the BI signal has been received;

a step of stopping the burst transfer when the CPU interface circuit indicates to do so;

a step of confirming that the Continue signal is asserted with the following requests, and when the Continue signal is asserted with the following requests, performing these holding requests in the CPU interface circuit, going back to step 3 to transfer data until the burst stop respectively, or when Continue signal is not asserted, ending the sequence with a closing step below; and a step of issuing a Precharge command to the memory to close the bank that are used.

This memory access device is characterized in that the step of the memory controller includes a step in which, when the BI signal comes, multiple Activate commands for corresponding banks are issued to the memory, or when no BI signal comes, one Activate command is issued.

This memory access device is characterized in that a DRAM is included as the memory.

In order to achieve the above objective, the present invention also provides a memory access method for a device including: multiple CPUs using a memory as these main memories that share the memory with a data buffer for other functional (data flow) blocks; the other functional (data flow) blocks using the memory as these data buffer; a CPU interface circuit connected to a bus for the CPUs to handle memory access requests from the multiple CPUs; and a memory controller connected to the CPU interface circuit to arbitrate memory access requests from the CPUs and the functional blocks. This method includes:

a step of queuing access requests (signals) from the multiple CPUs;

a step of receiving and storing the address, the data transfer mode and the data size of each access and notifying the memory controller of the access requests;

a step of sending the information to the memory controller in response to an allowed signal upon receiving the allowed signal for the access requests (signals); and a step of receiving the access request signals, specifying the CPUs whose access transfers are allowed based on access arbitration, and sending the allowed signal to the CPU interface.

Advantage of the Invention

As described above, according to the present invention, in a memory system shared by main memory for multiple CPUs and other memories such as a data buffer, when main memory access requests come, memory transfer is enabled while minimizing the access delay and reducing the overhead of the data transfer.

BRIEF DESCRIPTION OF THE DRAWINGS

FIG. 2 is a conceptual diagram showing memory transfers of the present invention in a DRAM configuration with multiple CPU accesses and data flow accesses;

FIG. 7 is a flowchart showing a command sequence for carrying out the present invention.

MODE FOR CARRYING OUT THE INVENTION

Figure 1:
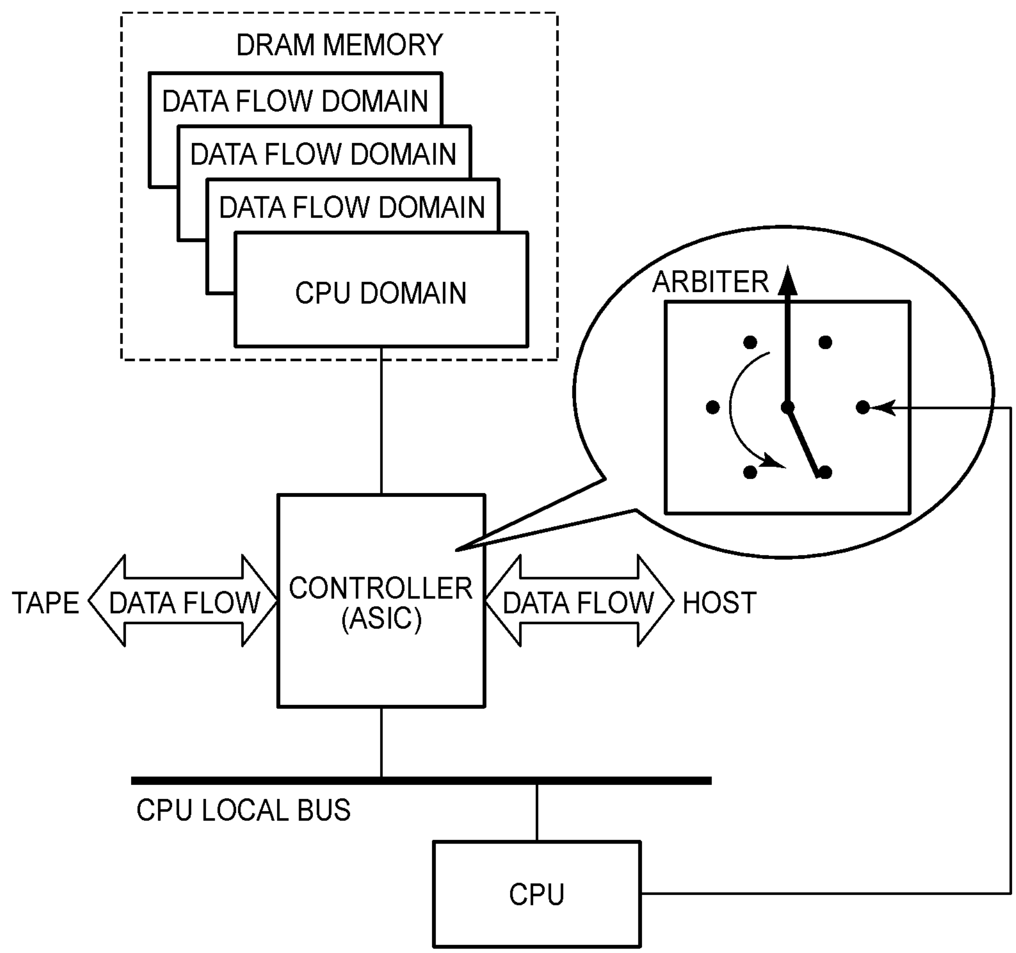
FIG. 1 shows an ASIC having a DRAM memory shared between access from a CPU (CPU access) and data flow transfers.

A DRAM access device according to a preferred embodiment (hereinafter simply called the "embodiment") of the present invention will be described below in terms of data flows in a recording device and accesses from multiple CPUs. Note that the following embodiment is an illustrative example, and is not intended to limit the content of the present invention.

In a memory system for shared use of main memories for multiple CPUs and another data buffer memory, when a CPU access request comes, the following methods are performed:

(a) When multiple main memory access requests come, if the transfer of another block is being performed, these requests are kept waiting. Then, after completion of the transfer of another block, these two transfer requests are performed in one cycle using a bank interleave (hereinafter also abbreviated as BI) defined in specifications such as DDR3 SDRAM.

(b) When a certain main memory access request comes, if the transfer of another block is being performed, the request is kept waiting. During this period, the next access request is issued from the same CPU. A DRAM memory controller (arbiter) allows the access to the main memory, and if the next transfer request is queued together with the CPU transfer already queued, it performs the next data transfer in the same cycle in consideration of conditions.

(c) A combination of the above two methods

By using these methods, the transfer overhead is reduced to perform efficient DRAM transfer.

According to (a), in an architecture in which the main memories for the multiple CPUs is logically divided into areas in the shared memory, respective areas are mapped with bank addresses of DDR3 SDRAM. In this case, even if the two CPU accesses are different in two areas of access destinations, two transfers are performed at a time using a bank interleave with the bank addresses. Thus, the problem 2 is solved with respect to the second and subsequent transfer requests.

According to (b), the first request is kept waiting until completion of the transfer of another block being performed, but the turn around time to subsequent transfer requests is greatly reduced. Thus, the problem 2 is solved with respect to the second and subsequent transfer requests.

According to (c), since the two techniques (a) and (b) are used in combination, transfer requests from the multiple CPUs are completed within one transfer cycle. Since accesses from the multiple CPUs are completed by one transfer, transfer overhead is reduced and hence efficiency in the use of memory bands is improved, improving the problem 1. Since extra bands can be secured, they can be allocated to the main memory band itself or a bands for other blocks (e.g., data flow blocks). This number of queues can be controlled depending on the system to realize a shared memory controller with high use efficiency.

FIG. 2 is a conceptual diagram showing memory transfers of the present invention in a DRAM configuration with multiple CPU accesses and data flow accesses. Referring to FIG. 2, the techniques (a) to (c) of the present invention will be described. FIG. 2B shows that a data bus 47 and a CPU local bus 48 make requests to an external DRAM 45. An information apparatus (e.g., storage device) is equipped with multiple CPUs for function control and the data bus 47 for reading/writing of data. An access transfer is made from each CPU 49 to the DRAM 45. In parallel with these access transfers, the memory for reading/writing of data is used as a data buffer 451. The CPU transfers (CPU accesses) from multiple CPUs 1, 2, and 3 use 452 in the DRAM. At this time, the addresses from respective CPUs are assigned different bank addresses by addressing using a bank interleave. FIG. 2A shows that the data bus 47 makes transfer 41 of 512 bytes once for data flow REQs 1, 2, . . . , respectively. During this transfer, transfers of multiple CPUs are kept waiting. Transfer 43 from CPUs 1, . . . is performs collectively by one transfer after completion of the data transfer. Thus, CPU access overhead 39 is reduced. 512 bytes of data in each data flow 41 is transferred in one transfer cycle, and during the cycle, CPU transfer is kept waiting to cause a delay in CPU access. When accesses from multiple CPUs continue and hence become busy, the delay in completing the data transfer affects each access transfer. The CPU access transfers are portions (shaded areas) 32B including Read/Write command, and these portions are small in size. Therefore, if two or more CPU accesses can be put together in one transfer, the CPU access overhead can be reduced in total. On the other hand, if CPU accesses can be aggregated, sufficient transfer bands can be secured not only for the transfer of CPU accesses but also for data flows, improving the throughput of data transfers.

Figure 3:
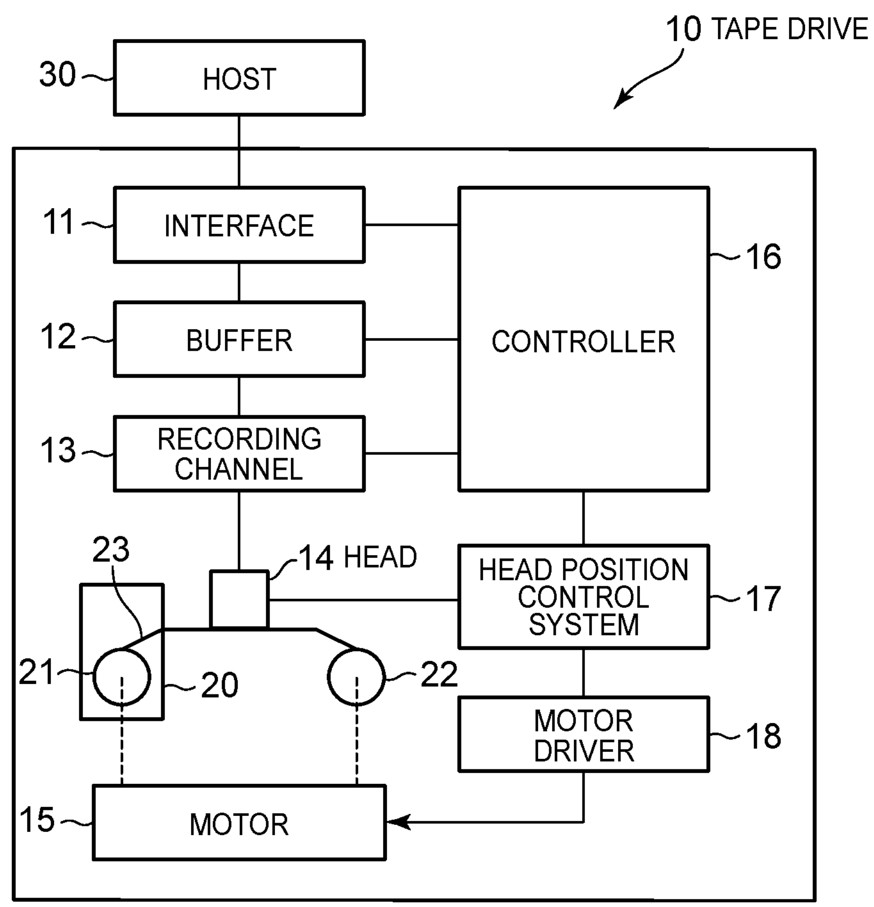
FIG. 3 is a block diagram showing the configuration of a tape recording device.

FIG. 3 is a block diagram showing the configuration of a tape drive 10. Here, the tape drive to which the embodiment is applied will be described. The tape drive 10 includes an interface 11, a data buffer 12, a recording channel 13, a tape 23, a head 14, reels 21 and 22, a cartridge 20, a motor 15, a controller 16, a head position control system 17, and a motor driver 18. The interface 11 communicates with a host 30.

The interface 11 receives a command instructing writing of data to be transferred from the host 30 to the data buffer 12, and a command instructing writing of data in the data buffer 12 onto the tape 23. For example, the communication standard for the interface 11 is SCSI or fiber channel.

The data buffer 12 is a memory for accumulating data to be written onto the tape 23. The data buffer 12 is partitioned into fixed-length segments. One segment corresponds to one data set on the tape 23. The data set has a data structure to which iterated code consisting of C1 parity and C2 parity is added. The data set (DataSet) contains, in a DSIT (Data Set Information Table), separator information on multiple records (data) included therein as attribute information. A CPU included in the controller 16 generates the DSIT for each data set in the data buffer 12. The DSIT is included in each data set. The generation of the DSIT means that the CPU can directly access the data buffer and execute firmware to add data management information.

The data buffer 12 is called a ring data buffer because it receives data up to the last segment, and then starts receiving data again from the first segment. The data has any length and is transferred from the host 30 to the drive. Even when fixed length data is transferred from the host, if the data is compressed, the data length will be different from data to data. These pieces of transfer data are accumulated into the segments of the data buffer 12 sequentially. The recording channel 13 is a communication path for writing segment data filled with various sizes of data onto a tape medium as a data set. The data accumulated in the data buffer 12 as a data set for each segment is written onto the tape medium. The writing timing is when the segment is filled up with data.

The tape 23 is a recording medium as data recording means. The data passed through the recording channel 13 is written by the head 14 onto the tape 23 as a data set. The tape 23 is wound between the reels 21 and 22 to move in the longitudinal direction from the reel 21 to the reel 23, or vice versa, along with the rotation. The cartridge 20 is a container to accommodate the reel 21 on which the tape 23 is wound. A cartridge of the same kind as the cartridge 20 may be provided to accommodate a reel 14*d*. The motor 15 drives the reels 21 and 22 to rotate.

The controller 16 controls the entire operation of the tape drive 10. The controller 16 controls writing/reading of data onto the tape 23 according to a command received at the interface 11 from the host 30. The controller also controls the head position control system 17 and the motor driver 18. The head position control system 17 follows a desired track. When the head 14 is required to switch between tracks, the head position control system 17 controls the head 14 to switch electrically. The motor driver 18 may also be directly connected to the controller 16.

Figure 4:
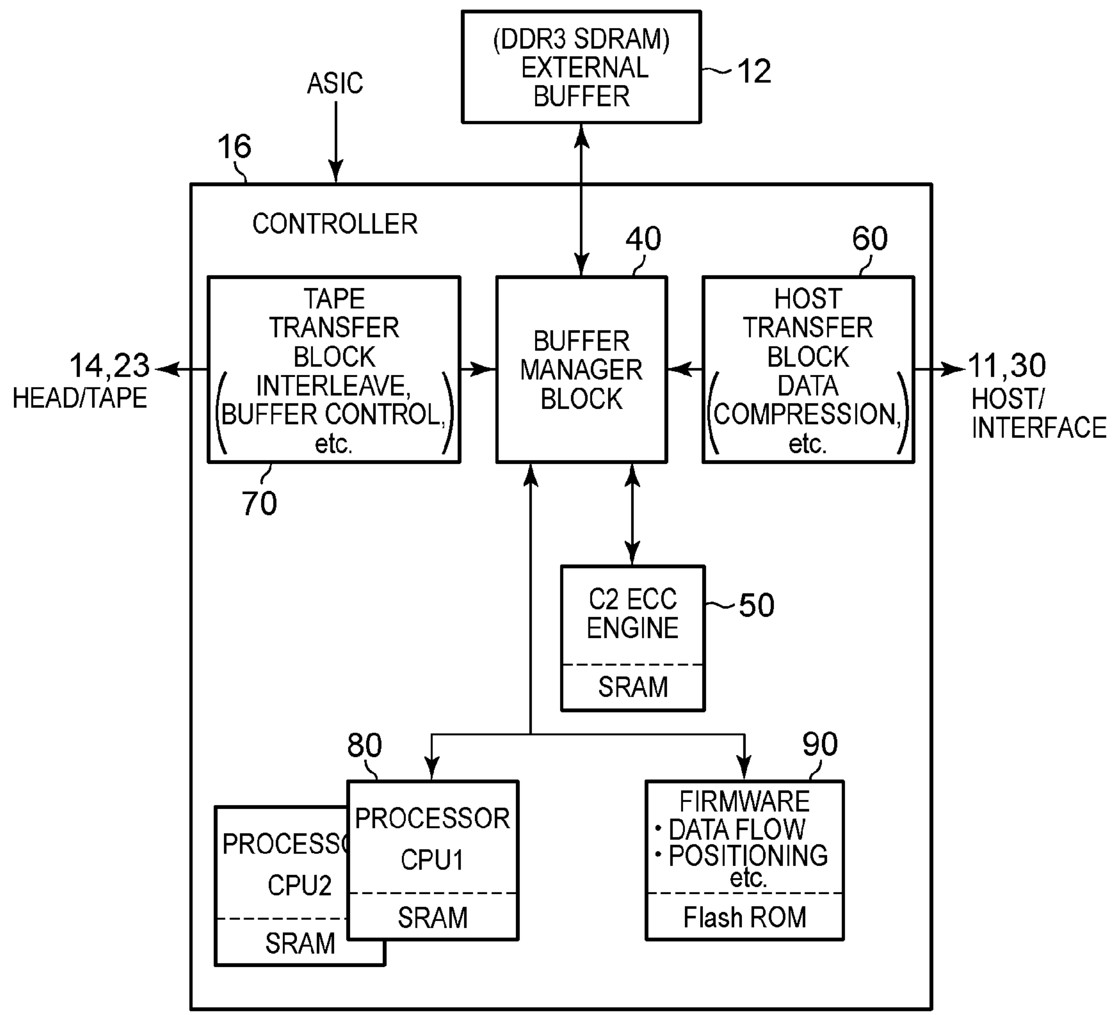
FIG. 4 shows a configuration (ASIC) of a DRAM controller included in a controller 16 of the tape drive and circuit blocks for performing data flow control and others.

FIG. 4 shows a configuration (ASIC) of a DRAM controller included in the controller 16 of the tape drive and circuit blocks for performing data flow control and others. The controller 16 includes functional blocks, such as processors 80 for performing various kinds of control, a flash ROM 90 storing firmware, a buffer manager 40, a tape transfer 70, a host transfer 60, and a C2 ECC calculator (error correction) 50. The tape transfer block 70 connects the tape 23 and the read/write head 14. The host transfer block 60 is connected to the host 30. The controller (ASIC) 16 controls association between the tape medium 23 and the head 14, and between the host 30 and the external buffer 12. Particularly, the buffer manager 40 has a function to arbitrate memory accesses among the external buffer 12, the tape transfer block 70, the host transfer block 60, the C2 ECC calculator block 50, and the two processors (CPU 1 and CPU 2) 80.

The following will describe a data transfer flow from when data is transferred from the host 30 to the data is written onto the tape. Data from the host transfer block 60 received from the host is once stored in the external buffer 12 through the buffer manager block 40. The buffer manager block 40 needs high bandwidth in order to perform high-speed pipeline processing on accesses of data transfers from each of functional blocks 50, 60, and 70 to the external buffer. The external buffer is, for example, a DDR3 SDRAM 12 having a four-byte or eight-byte bus width. The data stored in the external buffer 12 is transferred to an SRAM of the C2 ECC calculator 50. In the C2 ECC 50, errors in all pieces of data are corrected, and the corrected data is written back to the DDR3 SDRAM 12. As a function of the data flow controller, the buffer manager 40 switches between buses in a time-sharing manner to enable each of the functional blocks 50, 60, and 70 to access the DDR3 SDRAM 12 efficiently. The C2 ECC 50 has strict requirements for processing time because of such an architecture that data read from the DDR3 SDRAM 12 is written back to the DDR3 SDRAM 12.

To enable uniform pipeline processing on data transfer from each of the functional blocks, it is necessary to guarantee required bandwidth of each block. When the CPU controls host or media transfers, data is temporarily stored in the external buffer and processed sequentially. For example, in the case of writing from the host to the storage device, data from the host is first stored in the external buffer. Next, the data is read from the external buffer to add error correcting code (hereinafter, ECC). ECC parity calculated by the ECC calculator is stored again in the external buffer. After that, the data is read again from the external buffer to the media side. For one write or read, the buffer manager accesses the external buffer multiple times through multiple functional blocks. Further, these processes form a pipeline, and multiple access requests to the external buffer are issued at the same time.

Figure 5:
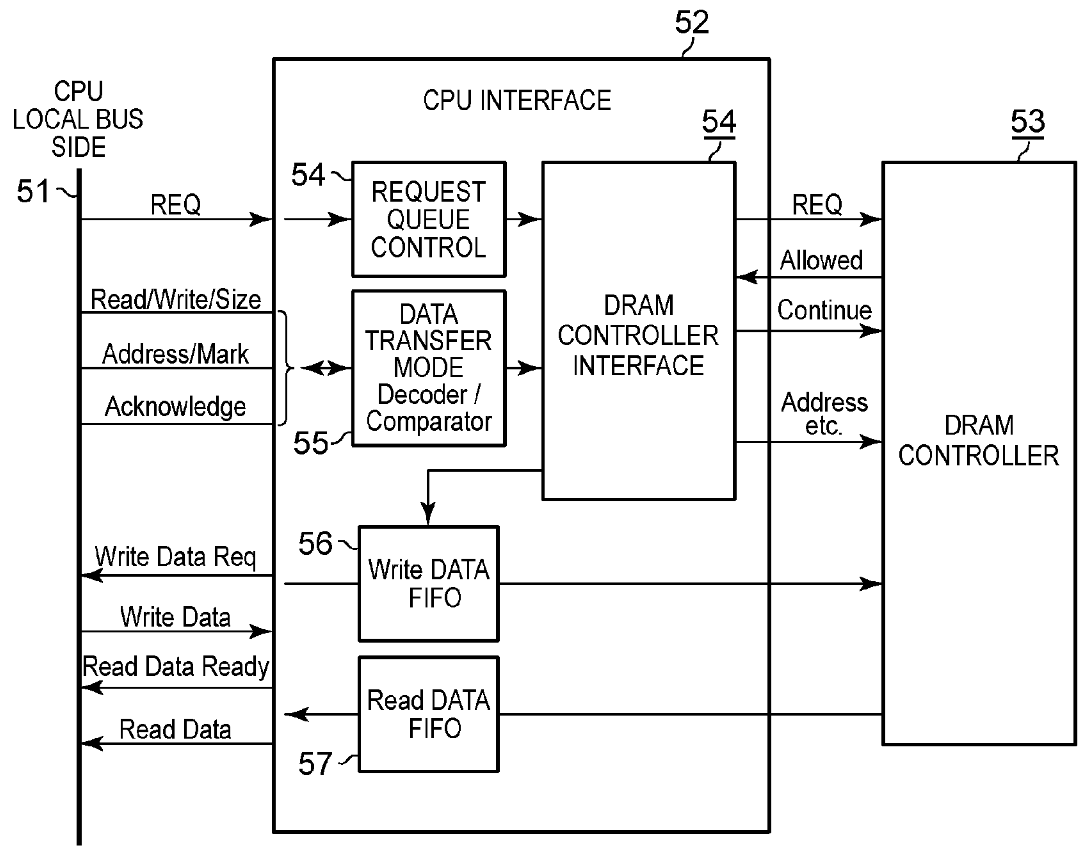
FIG. 5 is a block diagram showing connections among a local bus 51 for access blocks including multiple CPUs, a CPU interface, and a DRAM controller.

FIG. 5 is a block diagram showing connections among a local bus 51 for access blocks (not shown) including multiple CPUs, a CPU interface, and a DRAM controller. In FIG. 3, these DRAM access circuits are included in the controller 16. The DRAM controller shares the data buffer 12. Normally, the DRAM controller manages a sequence for issuing commands to a DRAM such as DDR3 SDRAM. Since an order of issuing optimum commands varies depending on accessing blocks, the command sequence is employed by a state machine in hardware. i.e. The DRAM controller consists of a command control circuit and a CPU interface circuit. A system is assumed in which a shared memory is used as two memories, a CPU main memory space and a data buffer space. Signal lines to a memory chip (not shown) are shared between both sides, and a DRAM controller 53 transfers data to and from the DRAM memory in a time-sharing manner while arbitrating each access block. Access blocks including main memory accesses from CPUs assert transfer requests (REQ signals), and when allowed, an Allowed signal is asserted to start each transfer. In the DRAM controller 53, when a block (not shown) from which access is allowed is decided, the command control circuit starts working to issue commands in a sequence according to the transfer block.

The following will describe a CPU interface (also called "CPU interface circuit" or "CPU interface block"). This circuit is connected to the local bus for multiple CPUs to perform access requests and data transfers. In relation with the DRAM controller side, this circuit sends DRAM transfer requests, performs data transfers after transfers are allowed. Signals such as address, Read/Write direction, and transfer data size are connected to the CPU local bus with a transfer request signal.

Figure 6:
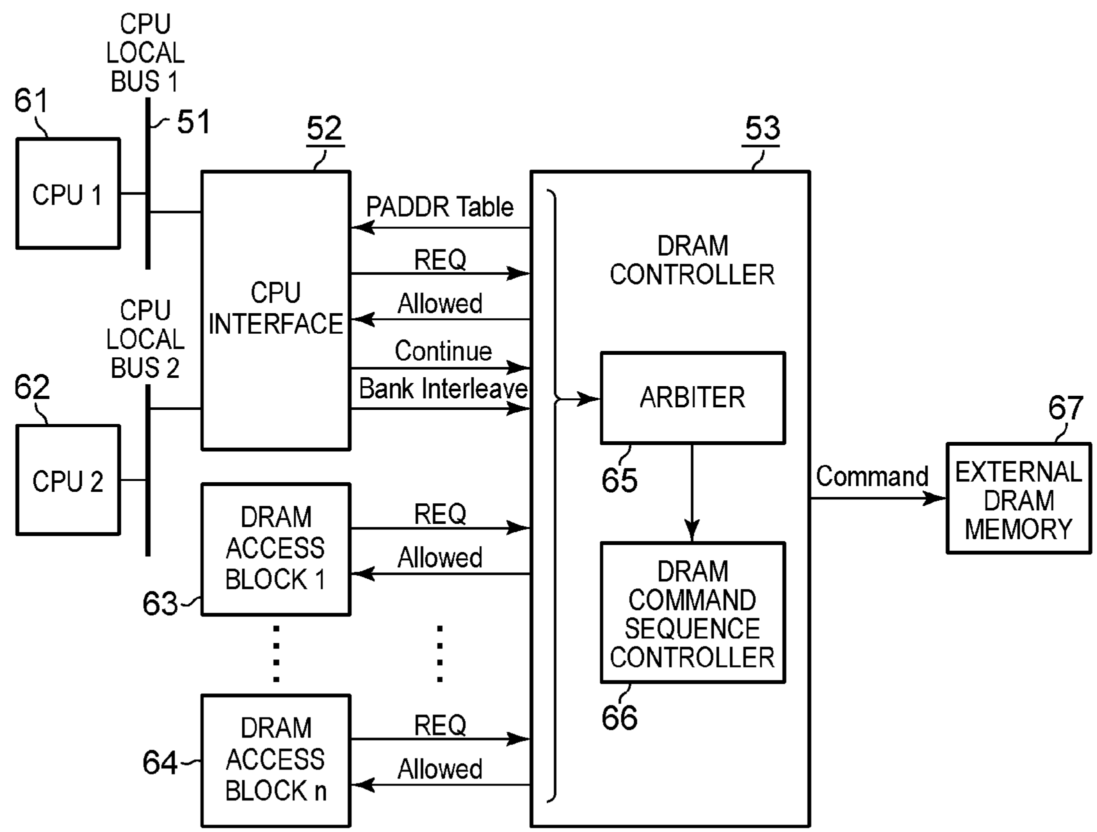
FIG. 6 shows that the CPU interface connects two or more local buses to the DRAM controller.

FIG. 6 shows that the CPU interface connects two or more CPU local buses to the controller. CPU 1 and CPU 2 are present as two interface blocks. DRAM access blocks 1, . . . , n are the other functional blocks of the information apparatus. For example, access blocks 63 and 64 are blocks for writing/reading of data in data flows. Accesses from the two CPUs to respective areas of a shared main memory are provided to an external DRAM memory 67 via the circuit of a CPU interface 52. Transfer request signals (REQ signals) are sent to a request queue control circuit 54 for handling queues. A first request is processed immediately by this control circuit 54 and a DRAM transfer request is sent to the DRAM controller 53. An arbiter 65 included in the DRAM controller arbitrates transfer requests including the those from the other blocks. When allowing CPU transfer (CPU access transfer), the DRAM controller raises an Allowed signal. The DRAM controller interface circuit 54 that has received the Allowed signal performs the transfer of memory addresses and Write data or Read data to or from the DRAM controller 53.

If no Allowed signal is asserted in response to the DRAM transfer requests from the CPUs, it will be a case when the accesses are not allowed because another block 63 or 64 is performing data transfer. The DRAM controller interface 54 waits for being allowed while keeping the REQ signals asserted. At this time, when a next transfer request comes, the request queue control circuit 54 accepts the request. The above three techniques a, b, and c are used separately depending on how to queue requests (i.e., depending on the request queues). When two request queues are accesses from two CPUs, the technique a is so used that when the Allowed signal comes, a bank interleave signal (BI signal) is asserted to enable transfer using the bank interleave. In this case, however, the bank addresses of the request addresses from the two CPUs need to be different from each other. On the other hand, when the two request queues come from the same CPU, the technique b is so used that when the Allowed signal comes, two requests are transferred in one cycle using a Continue signal. Alternatively, the technique c can be used to improve transfer efficiency. In other words, when a next request comes from a CPU whose previous access is being performed with operation a, operation b is executed during execution of the cycle.

Whether a next transfer request can be queued depends on the specifications of the CPU. Even if a Write request is not actually transferred to the main memory, the write cycle can be ended when the write data is received. In the case of Read transfer, if the CPU is capable of prefetching data, only the request can be so queued that Read data will be received later.

The following will describe the DRAM controller 53. When the above REQ signal has not been received yet, i.e., when the Allowed signal is not asserted, if access requests come from multiple CPUs, transfer using the bank interleave mode will be performed. Further, when the Allowed signal is asserted and the CPU interface 52 transfers the transfer mode information, the address, and the data at appropriate timing to or from a command sequence controller 66 of the DRAM controller. Upon completion of the data transfer, the Precharge command is issued at appropriate timing to end the cycle. Before that, the CPU interface 52 checks for the state of the transfer request queue, and if a next request is ready, the CPU interface 52 asserts the Continue signal and makes a request to the DRAM controller for the next transfer. The DRAM controller that has received the Continue signal issues a next transfer command (Write or Read), and processes the next request in the queue. Note that the arbiter 65 arbitrates accesses from multiple blocks.

FIG. 7 is a flowchart showing a command sequence for carrying out the present invention. This flowchart (left diagram) shows, as a flow of command sequence control, the operation of the present invention in a system for sharing multiple CPUs' main memories. The right diagram shows the functions of the CPU interface circuit and the DRAM controller in each step.

Step 0

CPU Interface:

A transfer mode (Read/Write) and an address(s) are sent to the DRAM controller.

Step 1

CPU Interface:

A transfer request(s) from multiple CPUs are received. If the requests come from two CPUs and their bank addresses are different from each other, bank interleave mode is executable. In this case, a BI signal indicative of entering a Bank Interleave mode is sent to the DRAM controller.

Step 2

DRAM Controller:

Whether the BI signal has been received is checked.

If the BI signal is asserted, the BI signal is received, and multiple Activate commands for corresponding banks are issued.

If the BI signal is not asserted, one Activate command is issued.

Step 3

CPU Interface:

Then, a queued main memory transfer, Read or Write, is performed. In the Bank Interleave mode, since respective accesses from multiple CPUs are queued, all of them will be performed. Data of the current request is transferred in burst while counting transfer words until the word count reaches the specified transfer size.

DRAM Controller:

When the CPU interface completes the burst transfer, control proceeds to step 4.

Step 4

CPU Interface:

When the next transfer requests have come up to this point and these request addresses are addresses capable of entering the BI mode, the Continue signal is sent to the DRAM controller.

DRAM Controller:

Whether the Continue signal is asserted is checked.

If the Continue signal is asserted, moves to step 3.

If the Continue signal is not asserted, proceeds to step 5 to end this transfer cycle.

Step 5

DRAM Controller:

When the transfer cycle is ended, the Precharge command closes ROW accesses.

Next, conditions for the CPU interface to assert the BI signal and Continue signal are considered. In the DRAM memory, consecutive addresses can be accessed continuously without additional overhead. Specifically, this is a case where bank and Row addresses of the DRAM memory are the same. The DRAM memory has bank, row, and column addresses. If the bank and row addresses are the same, any column address can be addressed under this condition. This means that step 3 in FIG. 7 is repeated. Thus, two or more access requests can be transferred under this condition with an overhead of one cycle.

If Row addresses are different, the Activate command needs to be issued in each case. This means that step 2 in FIG. 7 is required. Since the Precharge command in step 5 specifies a Bank address and is executed on the bank, even if Row addresses are different, it can be completed by one Precharge as long as the Bank addresses are the same.

If bank addresses are different, Activate commands must be issued. Since the Precharge command after completion of the transfer can be issued to all banks, the overhead is not increased. Thus, use of the bank interleave to complete accesses from the multiple CPUs by one transfer can reduce the overhead for the Precharge command.

A case where among transfer requests from the multiple CPUs, it brings the best result to the present invention that requests with bank addresses different each other but each having the same Bank and Row addresses are performed continuously. Therefore, in the aforementioned embodiment, the condition for asserting the Continue signal is set such that the Bank and Row addresses are the same as those of the previous transfer. Here, Bank addresses and others are addresses of the DRAM. Since addresses used by CPUs are logical addresses but the DRAM addresses are physical addresses, it requires a method for the CPU interface circuit to determine a Continue condition from CPU logical addresses. Therefore, a table indicating which bit of each logical address is mapped to a Bank address and which bit is mapped to a Row address is passed from the DRAM controller to the CPU interface. Using this table, the CPU interface determines whether addresses before and after a requested address are the same physical address to set it as the Continue condition. This is indicated as a "PADDR Table" signal between the CPU interface and the DRAM controller in FIG. 6.

As described above, in the embodiment, the above-mentioned features are implemented on both the CPU interface and the DRAM controller to enable the transfer of multiple requests from multiple CPUs in one DRAM access cycle, thereby improving usage efficiency of bandwidth. As an example, CPU access with a cache size of 32 bytes is considered. If the bus width of the DRAM is 32 bits, since one word is four bytes in DDR3 SDRAM, transfer can be achieved in eight bursts. Since in a DDR memory two bursts occur in one clock cycle, the data transfer clock cycle is four clocks. However, in accordance with the prescribed AC timing of DDR3 SDRAM, this cycle requires about 22 clocks to read. This number of clocks depends on the operating frequency and other parameters. Only in the case of this access, the overhead is more than 80 percent. When the features of this application is applied to this case, for example, when two transfers from two CPUs are performed collectively in one cycle, a transfer of 64 bytes in total can be performed while reducing the overhead to about 50 percent.

According to the present invention, since there are data flow transfers as transfers other than those from CPUs, accesses from multiple CPUs (with a short burst length) are transferred efficiently in a framework of the arbiter system for interposing the CPU transfers in the interim period. As the burst length is short, the transfer overhead of the DDR memory becomes relatively large, reducing transfer efficiency. The scope of present invention covers as many CPU accesses as possible at the maximum efficiency in an environment of using such a shared memory.

DESCRIPTION OF REFERENCE NUMERALS

10 . . . Tape Drive
11 . . . Interface
12 . . . Data Buffer
13 . . . Channel
14 . . . Head
15 . . . Motor
16 . . . Controller (ASIC)
17 . . . Head Position Control System
18 . . . Motor Driver
20 . . . Cartridge
21, 22 . . . Reel
30 . . . Host
40 . . . Buffer Manager Block
50 . . . C2 ECC Calculator
60 . . . Host Transfer Block
70 . . . Tape Transfer Block
80 . . . Processor
90 . . . Firmware

The invention claimed is:

1. A memory access device for shared use of a memory, the device comprising:

multiple CPUs using the memory as main memories;

other functional blocks using the memory as a data buffer;

a CPU interface circuit connected to a bus for the multiple CPUs to control memory access requests from the multiple CPUs; and, a memory controller connected to the CPU interface circuit to arbitrate the memory access requests from the multiple CPUs and the other functional blocks, wherein:

the CPU interface circuit holds the memory access requests from the multiple CPUs, receives and stores an address, a data transfer mode, and a data size of each CPU access, notifies the memory controller of the memory access requests, and on receiving an Allowed signal for the memory access requests, sends the information to the memory controller, and on not receiving the Allowed signal for the memory access requests, holds awaiting the memory access requests from the multiple CPUs; and the memory controller receives the memory access request signals, specifies a CPU whose memory access requests are allowed from access arbitration, and sends the Allowed signal to the CPU interface circuit and executes the multiple CPU memory access requests in one bus cycle, wherein in response to a data flow transfer of the other functional blocks being performed, the memory controller holds the multiple CPU memory access requests, and after completion of the data flow transfer performs the multiple CPU memory access requests in one transfer cycle.

2. The memory access device of claim 1, wherein the memory is a DRAM.

3. The memory access device of claim 2, wherein the memory controller performs the memory access requests from the multiple CPUs in one transfer cycle using a bank interleave (BI) of the DRAM.

4. The memory access device of claim 3, wherein on receiving BI signal, a plurality of Activate commands for corresponding banks are issued to the memory, and on not receiving the BI signal, one Activate command is issued.

5. The memory access device of claim 4, wherein the CPU interface circuit performs:

sending a transfer mode and an address of each access to the memory controller;

receiving transfer requests from multiple CPUs, and in response to bank addresses being different, sending a BI signal which indicates to the memory controller to enter bank interleave mode.

6. The memory access device of claim 5, wherein the memory controller performs:

checking whether the BI signal has been received;

stopping burst transfer by notifying the CPU interface circuit;

confirming that Continue signal is asserted for the multiple CPUs, and, performing next requests queued on the CPU interface circuit;

performing burst stop, and in response to the Continue signal is not being asserted, issuing a Precharge command to the memory to close those banks that are used.

7. A method for shared use of a memory, the method comprising:

using, by multiple CPUs, the memory as main memories;

using, by other functional blocks, the memory as a data buffer;

controlling, via a CPU interface circuit connected to a bus for the multiple CPUs, memory access requests from the multiple CPUs; and, arbitrating, via a memory controller connected to the CPU interface circuit, the memory access requests from the multiple CPUs and the other functional blocks, wherein:

the CPU interface circuit holds the memory access requests from the multiple CPUs, receives and stores an address, a data transfer mode, and a data size of each CPU access, notifies the memory controller of the memory access requests, and on receiving an Allowed signal for the memory access requests, sends the information to the memory controller, and on not receiving the Allowed signal for the memory access requests, holds awaiting the memory access requests from the multiple CPUs; and the memory controller receives the memory access request signals, specifies a CPU whose memory access requests are allowed from access arbitration, and sends the Allowed signal to the CPU interface circuit and executes the multiple CPU memory access requests in one bus cycle, wherein in response to a data flow transfer of the other functional blocks being performed, the memory controller holds the multiple CPU memory access requests, and after completion of the data flow transfer performs the multiple CPU memory access requests in one transfer cycle.

8. The method of claim 7, wherein the memory is a DRAM.

9. The method of claim 8, wherein the memory controller performs the memory access requests from the multiple CPUs in one transfer cycle using a bank interleave (BI) of the DRAM.

10. The method of claim 9, wherein on receiving BI signal, a plurality of Activate commands for corresponding banks are issued to the memory, and on not receiving the BI signal, one Activate command is issued.

11. The method of claim 10, wherein the CPU interface circuit performs:

sending a transfer mode and an address of each access to the memory controller;

receiving transfer requests from multiple CPUs, and in response to bank addresses being different, sending a BI signal which indicates to the memory controller to enter bank interleave mode.

12. The method of claim 11, wherein the memory controller performs:

checking whether the BI signal has been received;

stopping burst transfer by notifying the CPU interface circuit;

confirming that Continue signal is asserted for the multiple CPUs, and, performing next requests queued on the CPU interface circuit;

performing burst stop, and in response to the Continue signal is not being asserted, issuing a Precharge command to the memory to close those banks that are used.

13. A non-transitory computer readable device including a program executable by a processor, the program causing the processor to perform operations, the operations comprising:

using, by multiple CPUs, a memory as main memories;

using, by other functional blocks, the memory as a data buffer;

controlling, via a CPU interface circuit connected to a bus for the multiple CPUs, memory access requests from the multiple CPUs; and, arbitrating, via a memory controller connected to the CPU interface circuit, the memory access requests from the multiple CPUs and the other functional blocks, wherein:

the CPU interface circuit holds the memory access requests from the multiple CPUs, receives and stores an address, a data transfer mode, and a data size of each CPU access, notifies the memory controller of the memory access requests, and on receiving an Allowed signal for the memory access requests, sends the information to the memory controller, and on not receiving the Allowed signal for the memory access requests, holds awaiting the memory access requests from the multiple CPUs; and the memory controller receives the memory access request signals, specifies a CPU whose memory access requests are allowed from access arbitration, and sends the Allowed signal to the CPU interface circuit and executes the multiple CPU memory access requests in one bus cycle, wherein in response to a data flow transfer of the other functional blocks being performed, the memory controller holds the multiple CPU memory access requests, and after completion of the data flow transfer performs the multiple CPU memory access requests in one transfer cycle.

14. The non-transitory computer readable device of claim 13, wherein the memory is a DRAM.

15. The non-transitory computer readable device of claim 14, wherein the memory controller performs the memory access requests from the multiple CPUs in one transfer cycle using a bank interleave (BI) of the DRAM.

16. The non-transitory computer readable device of claim 15, wherein on receiving BI signal, a plurality of Activate commands for corresponding banks are issued to the memory, and on not receiving the BI signal, one Activate command is issued.

17. The non-transitory computer readable device of claim 16, wherein the CPU interface circuit performs:

sending a transfer mode and an address of each access to the memory controller;

receiving transfer requests from multiple CPUs, and in response to bank addresses being different, sending a BI signal which indicates to the memory controller to enter bank interleave mode.

* * * * *